United States Patent
Park et al.

(10) Patent No.: US 7,937,642 B2
(45) Date of Patent: May 3, 2011

(54) APPARATUS AND METHOD FOR RECEIVING SIGNAL IN A COMMUNICATION SYSTEM

(75) Inventors: Sung-Eun Park, Seoul (KR); Dong-Seek Park, Yongin-si (KR); Jae-Yoel Kim, Suwon-si (KR); Kyeong-Cheol Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 940 days.

(21) Appl. No.: 11/768,079

(22) Filed: Jun. 25, 2007

(65) Prior Publication Data
US 2008/0010579 A1    Jan. 10, 2008

(51) Int. Cl.
*H03M 13/00*    (2006.01)

(52) U.S. Cl. ........................... 714/758; 714/801

(58) Field of Classification Search ............ 714/758, 714/801
See application file for complete search history.

(56) References Cited

U.S. PATENT DOCUMENTS

| | | | |
|---|---|---|---|
| 7,266,750 B1 * | 9/2007 | Patapoutian et al. | 714/758 |
| 7,454,685 B2 * | 11/2008 | Kim et al. | 714/758 |
| 2004/0187129 A1 * | 9/2004 | Richardson | 718/100 |
| 2005/0268204 A1 * | 12/2005 | Harada | 714/758 |
| 2006/0123318 A1 * | 6/2006 | Kim et al. | 714/758 |
| 2006/0136799 A1 | 6/2006 | Choi et al. | |
| 2008/0028272 A1 * | 1/2008 | Richardson | 714/752 |

* cited by examiner

*Primary Examiner* — M. Mujtaba K Chaudry
(74) *Attorney, Agent, or Firm* — Jefferson IP Law, LLP

(57) ABSTRACT

An apparatus and method of receiving a signal in a communication system are provided, in which a signal is received and decoded by a PPS scheme being an LDPC decoding scheme in which an order of performing a node operation is scheduled.

13 Claims, 3 Drawing Sheets

APPARATUS AND METHOD FOR RECEIVING SIGNAL IN A COMMUNICATION SYSTEM

CROSS-REFERENCE TO RELATED PATENT APPLICATION

This application claims the benefit under 35 U.S.C. §119 (a) of a Korean Patent Application filed on Jun. 27, 2006 in the Korean Intellectual Property Office and assigned Serial No. 2006-58337, the entire disclosure of which is hereby incorporated by reference.

BACKGROUND OF THE INVENTION

1. Field of the Invention

The present invention generally relates to a communication system. More particularly, the present invention relates to an apparatus and method for receiving a signal in a communication system.

2. Description of the Related Art

In general, communication systems are being developed to provide high-speed large-data transmission services to Mobile Stations (MSs). In this context, Low Density Parity Check (LDPC) codes are seriously considered for the communication systems because the LDPC codes are channel codes suitable for high-speed large-data transmission.

With reference to FIG. 1, the configuration of a signal transmission apparatus in a conventional communication system using LDPC codes will be described below.

FIG. 1 is a block diagram of a signal transmission apparatus in a conventional communication system using LDPC codes.

Referring to FIG. 1, the signal transmission apparatus includes an encoder 111, a modulator 113, and a transmitter 115. Upon generation of transmission data, i.e. an information vector, the encoder 111 encodes the information vector to a codeword vector in a predetermined coding scheme. Herein, the coding scheme is LDPC coding and thus the codeword vector is an LDPC codeword. The modulator 113 modulates the LDPC codeword in a predetermined modulation scheme. The transmitter 115 processes the modulated vector received from the modulator 113 and transmits the processed signal to a signal reception apparatus.

With reference to FIG. 2, a configuration of a signal reception apparatus in a conventional communication system using LDPC codes will be described below.

FIG. 2 is a block diagram of a signal reception apparatus in a conventional communication system using LDPC codes.

Referring to FIG. 2, the signal reception apparatus includes a receiver 211, a demodulator 213, and a decoder 215. The receiver 211 processes a signal received from the signal transmitting apparatus through an antenna. The demodulator 213 demodulates the received vector from the receiver 211 in a demodulation scheme corresponding to the modulation scheme of the modulator 113. The decoder 215 decodes the demodulated vector received from the demodulator 213 in a decoding scheme corresponding to the coding scheme of the encoder 111 and outputs the decoded signal as a final recovered information vector. It is assumed herein that the decoding scheme, i.e. the LDPC decoding is performed by a sum-product iterative decoding algorithm.

An LDPC code is defined by a parity check matrix that contains zeroes mostly and a very small number of non-zeroes, for example, ones. The LDPC code can be represented as a bipartite graph. The bipartite graph includes variable nodes (i.e. bit nodes), check nodes, and edges connecting them LDPC decoding can be performed by a sum-product iterative decoding algorithm on the bipartite graph. The sum-product algorithm is a kind of a message passing algorithm that exchanges messages along the edges, calculates outgoing messages from incoming messages to the bit nodes or check nodes, and updates them on the bipartite graph.

In implementing the message passing algorithm on the bipartite graph, a bit node operation and a check node operation are sequentially performed. That is, the bit node operation is performed on all bit nodes sequentially and the check node operation is performed on all check nodes sequentially. The resulting increase in processing time delays the LDPC decoding. Accordingly, there exists a need for reducing the time taken for LDPC decoding without affecting LDPC decoding performance.

SUMMARY OF THE INVENTION

An aspect of the present invention is to address at least the problems and/or disadvantages and to provide at least the advantages described below. Accordingly, an aspect of the present invention is to provide an apparatus and method for receiving a signal in a communication system using LDPC codes.

Moreover, an aspect of the present invention provides a signal receiving apparatus and method of performing LDPC decoding by Partial Parallel Scheduling (PPS).

In accordance with an aspect of the present invention, a method of receiving a signal in a signal receiving apparatus is provided. A signal is received and decoded by a PPS scheme being an LDPC decoding scheme in which an order of performing a node operation is scheduled.

In accordance with another aspect of the present invention, a signal receiving apparatus is provided. A decoder decodes a received signal by a PPS scheme being an LDPC decoding scheme in which an order of performing a node operation is scheduled.

In accordance with a further aspect of the present invention, a method of receiving a signal in a signal receiving apparatus is provided. A bit node operation is performed on a received signal on a PPS group basis, and a check node operation is performed on all check nodes connected to each of bits nodes for which the bit node operation has been performed. If the LDPC code is a structured LDPC code for which a parity check matrix includes n row blocks each having L rows, a PPS group is generated by selecting one row from each of the n row blocks.

In accordance with still another aspect of the present invention, a signal receiving apparatus is provided. N bit node updaters perform a bit node operation on a received signal on a PPS group basis, n being a plural number, and n×Dv check node updaters perform a check node operation on all check nodes connected to each of bit nodes for which the bit node operation has been performed. If the LDPC code is a structured LDPC code for which a parity check matrix includes n row blocks each having L rows, a PPS group is generated by selecting one row from each of the n row blocks.

BRIEF DESCRIPTION OF THE DRAWINGS

The above and other aspects, features and advantages of certain exemplary embodiments of the present invention will be more apparent from the following detailed description taken in conjunction with the accompanying drawings, in which.

Throughout the drawings, the same drawing reference numerals will be understood to refer to the same elements, features and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
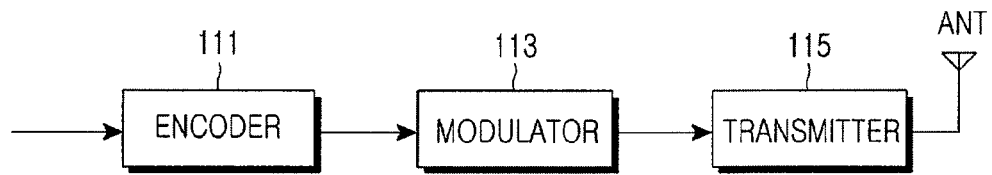
FIG. 1 is a block diagram of a signal transmission apparatus in a conventional communication system using LDPC codes.
Figure 2:
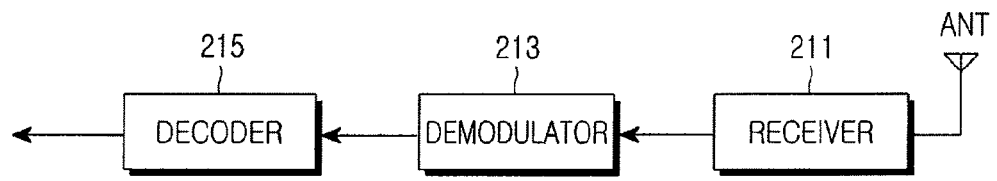
FIG. 2 is a block diagram of a signal reception apparatus in a conventional communication system using LDPC codes.

The present invention provides a signal receiving apparatus and method of performing LDPC decoding by PPS in a communication system using LDPC codes. The PPS-based LDPC decoding will be described, taking a variable node operation, i.e. a bit node operation, by way of example, and it is to be clearly understood that the PPS-based LDPC decoding is also applicable to a check node operation. While not described specifically, an LDPC code can be decoded by the PPS scheme of the present invention in the conventional signal receiving apparatus illustrated in FIG. 2. Before describing a signal receiving apparatus and method for decoding an LDPC code by the PPS scheme, a parity check matrix that specifies an LDPC code will first be described below.

As longer cycles are generated on an LDPC code bipartite graph, performance degradation, such as error floor, caused by shorter cycles, for example, cycles of length 4 can be avoided. Therefore, it is important to generate a parity check matrix such that the bipartite graph does not have short cycles. Such a major parity check matrix is one that defines a structured LDPC code. Now a description will be made of the parity check matrix for the structured LDPC code.

Figures 3, 4:
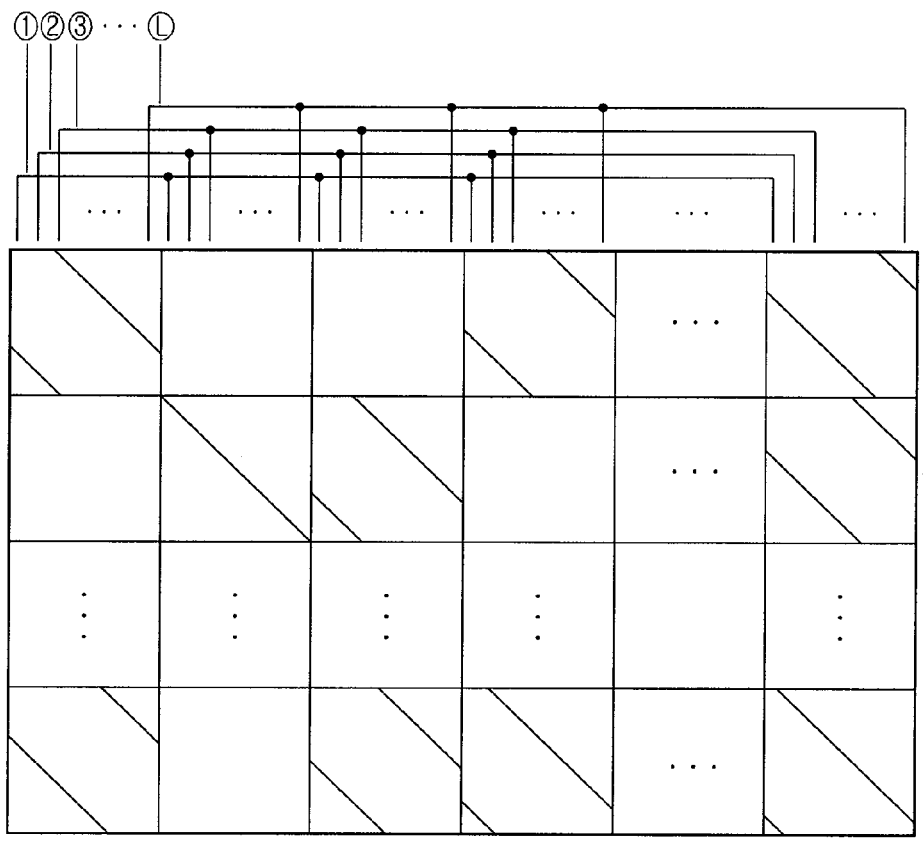
FIG. 3 illustrates a parity check matrix for a conventional structured LDPC code.
FIG. 4 illustrates a method for decoding a structured LDPC code by PPS according to an exemplary embodiment of the present invention.

FIG. 3 illustrates a parity check matrix for a conventional structured LDPC code.

Referring to FIG. 3, the structured LDPC parity check matrix includes a plurality of blocks each being a block matrix. The block matrix is an Ns×Ns permutation matrix, for example. The permutation matrix has a row weight of 1 for each row and a column weight of 1 for each column. For convenience sake, the permutation matrix is assumed to be a cyclic permutation matrix created by cyclically shifting an identity matrix to the right. The number of times by which the identity matrix is cyclically shifted to the right is defined as the shift parameter of the cyclic permutation matrix.

In FIG. 3, the structured LDPC parity check matrix has p×q blocks each being a block matrix. $P_{ij}$ denotes a block matrix in an $i^{th}$ block row and a $j^{th}$ block column.

A method for decoding a structured LDPC code by PPS according to an exemplary embodiment of the present invention will be described with reference to FIG. 4.

FIG. 4 illustrates a method for decoding a structured LDPC code by PPS according to an exemplary embodiment of the present invention.

Referring to FIG. 4, in an exemplary implementation, a parity check matrix for the structured LDPC code includes n row blocks each having L rows, thus n×L rows in total. A PPS group is created by selecting one row from each of the n row blocks so that the PPS group has a row weight of 1 or less. In FIG. 4, a first PPS group is formed by selecting the first row of each of the n row blocks and a second PPS group is formed by selecting the second row of each of the n row blocks. In this manner, an $L^{th}$ PPS group is formed by an $L^{th}$ row of each of the n row blocks. Thus, the first to $L^{th}$ PPS groups each have n rows. Also, the first to $L^{th}$ PPS groups each have a column weight equal to or less than a threshold, for example, 1. A condition for setting the weight of an arbitrary block column in each PPS group to be 1 or less is that blocks corresponding to permutation matrices other than zero matrices in the column block have different shift parameters.

In the above-described manner, the structured LDPC parity check matrix is created by defining the first to $L^{th}$ PPS groups so that the weight of an arbitrary column is 1 or less in each PPS group. Thus, it becomes possible to decode a structured LDPC code by scheduling the order of performing a bit node operation for the PPS groups.

More specifically, the PPS scheme of the present invention is an LDPC decoding method that schedules the order of performing a node operation so that a partial parallel operation is performed from the perspective of bit nodes. To carry out the PPS scheme, a decoder is provided with n bit node processors and decodes a structured LDPC code by performing a bit node operation on a PPS group basis. That is, the n bit node processors perform the bit node operation on the rows of the first PPS group in a first time interval, on the rows of the second PPS group in a second time interval, and in the same manner, on the rows of the $L^{th}$ PPS group in an $L^{th}$ time interval. Thus, one of iterative decodings is completed.

A description will be made below of an LDPC decoder using the PPS scheme according to an exemplary embodiment of the present invention.

Figure 5:
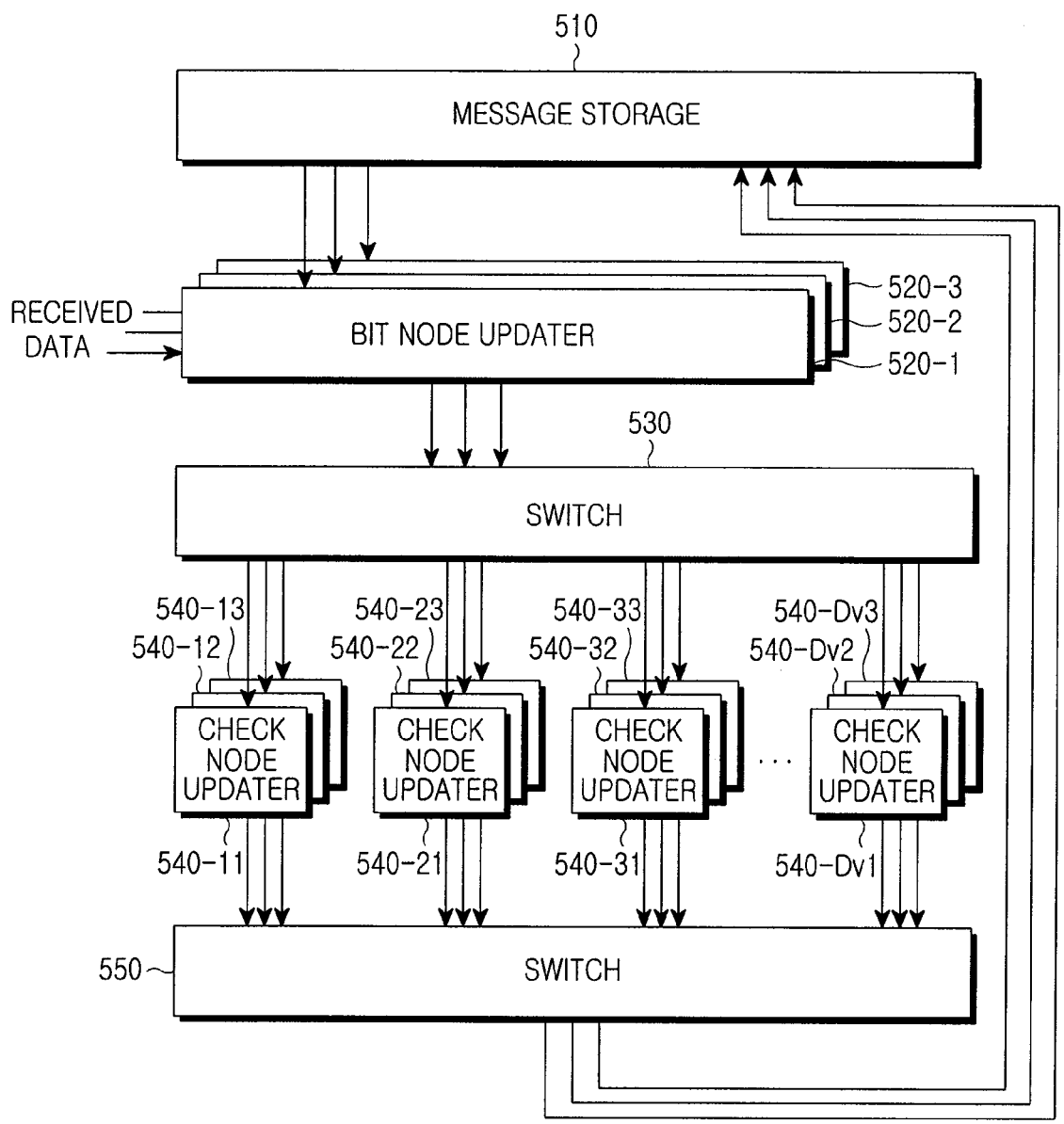
FIG. 5 is a block diagram of an LDPC decoder using PPS according to an exemplary embodiment of the present invention.

FIG. 5 is a block diagram of an LDPC decoder using the PPS scheme according to an exemplary embodiment of the present invention.

In exemplary implementation, a structured LDPC parity check matrix includes L PPS groups each having three row blocks. In this case, the LDPC decoder includes a message storage 510, three bit node updaters 520-1, 520-2, and 520-3, a switch 530, Dv×3 check node updaters 540-11 to 540-Dv3.

The bit node updaters 520-1, 520-2 and 520-3 receive data from the message storage 510, perform a bit node operation on the received data, and provide the results of the bit node operation to the check node updaters 540-11 to 540-Dv3 through the switch 530. The bit node operation itself is beyond the scope of an exemplary embodiment of the present invention and thus its detailed description is not provided herein. The check node updaters 540-11 to 540-Dv3 perform a check node operation on neighbor check nodes connected to bit nodes updated by the bit node updaters 520-1, 520-2 and 520-3 and store the results of the check node operation in the message storage 510 through the switch 530. The check node operation itself is beyond the scope of an exemplary embodiment of the present invention and thus its detailed description is not provided herein.

In the illustrated case of FIG. 5, the check node updaters 540-11, 540-21, 540-31, . . . , 540-Dv1 perform the check node operation on neighbor check nodes connected to a bit node updated by the bit node updater 520-1. The check node updaters 540-12, 540-22, 540-32, . . . , 540-Dv2 perform the check node operation on neighbor check nodes connected to a bit node updated by the bit node updater 520-2. The check node updaters 540-13, 540-23, 540-33, . . . , 540-Dv3 perform the check node operation on neighbor check nodes connected to a bit node updated by the bit node updater 520-3.

In the PPS-based LDPC decoding, consequently, each bit node is updated once during one iteration and check nodes are updated each time their neighbor bit node is updated. The PPS scheme accumulates updated check node operation results and reflects the accumulation in the next bit node operation during an iteration. The PPS scheme offers the benefit of fast Bit Error Rate (BER) performance conversion. That is, BER performance quickly converges with a relatively small number of iterations in the PPS scheme.

As described above, exemplary embodiments of the present invention advantageously reduces the time taken for LDPC decoding, while maintaining LDPC decoding performance by decoding an LDPC code by PPS.

While the invention has been shown and described with reference to certain exemplary embodiments of the present invention thereof, it will be understood by those skilled in the art that various changes in form and details may be made therein without departing from the spirit and scope of the present invention as defined by the appended claims and their equivalents.

What is claimed is:

1. A method of receiving a signal in a signal receiving apparatus, the method comprising:
   receiving a signal; and
   decoding the received signal by a Partial Parallel Scheduling (PPS) scheme comprising a Low Density Parity Check (LDPC) decoding scheme in which an order of performing a node operation is scheduled.

2. The method of claim 1, wherein the decoding of the received signal comprises, if the node operation is a bit node operation, performing a check node operation on all check nodes connected to a bit node each time the node operation is performed on the bit node.

3. The method of claim 1, wherein if the LDPC code comprises a structured LDPC code for which a parity check matrix includes n row blocks each having L rows, the PPS scheme comprises a scheme for scheduling the order of performing the node operation on a PPS group basis by the PPS scheme, a PPS group generated by selecting one row from each of the n row blocks.

4. The method of claim 3, wherein a column block included in the PPS group has a weight equal to or less than a threshold.

5. A signal receiving apparatus, comprising:
   a decoder of decoding a received signal by a Partial Parallel Scheduling (PPS) scheme comprising a Low Density Parity Check (LDPC) decoding scheme in which an order of performing a node operation is scheduled.

6. The signal receiving apparatus of claim 5, further comprising a receiver for receiving the signal.

7. The signal receiving apparatus of claim 5, wherein if the node operation comprises a bit node operation, the decoder performs a check node operation on all check nodes connected to a bit node each time the node operation is performed on the bit node.

8. The signal receiving apparatus of claim 5, wherein if the LDPC code comprises a structured LDPC code for which a parity check matrix includes n row blocks each having L rows, the PPS scheme comprises a scheme for scheduling the order of performing the node operation on a PPS group basis, a PPS group being generated by selecting one row from each of the n row blocks.

9. The signal receiving apparatus of claim 8, wherein a column block included in the PPS group has a weight equal to or less than a threshold.

10. A method of receiving a signal in a signal receiving apparatus, the method comprising:
    performing a bit node operation on a received signal on a Partial Parallel Scheduling (PPS) group basis; and
    performing a check node operation on all check nodes connected to each of bits nodes for which the bit node operation has been performed,
    wherein if the LDPC code comprises a structured LDPC code for which a parity check matrix includes n row blocks each having L rows, a PPS group is generated by selecting one row from each of the n row blocks.

11. The method of claim 10, wherein a column block included in the PPS group has a weight equal to or less than a threshold.

12. A signal receiving apparatus, comprising:
    n bit node updaters of performing a bit node operation on a received signal on a Partial Parallel Scheduling (PPS) group basis, n being a plural number; and
    n×Dv check node updaters of performing a check node operation on all check nodes connected to each of bits nodes for which the bit node operation has been performed,
    wherein if the LDPC code comprises a structured LDPC code for which a parity check matrix includes n row blocks each having L rows, a PPS group is generated by selecting one row from each of the n row blocks.

13. The signal receiving apparatus of claim 12, wherein a column block included in the PPS group has a weight equal to or less than a threshold.

* * * * *